(12) United States Patent
Lin et al.

(10) Patent No.: US 7,767,984 B2
(45) Date of Patent: Aug. 3, 2010

(54) RESIST COLLAPSE PREVENTION USING IMMERSED HARDENING

(75) Inventors: Burn-Jeng Lin, Hsin-Chu (TW); Ching-Yu Chang, Yilang County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 211 days.

(21) Appl. No.: 12/150,955

(22) Filed: May 1, 2008

(65) Prior Publication Data

US 2008/0203322 A1    Aug. 28, 2008

Related U.S. Application Data

(62) Division of application No. 11/043,598, filed on Jan. 25, 2005, now Pat. No. 7,384,726.

(51) Int. Cl.
*G03F 7/00* (2006.01)
*G21K 5/02* (2006.01)

(52) U.S. Cl. ............ 250/492.1; 250/492.2; 250/492.24; 430/311; 430/330

(58) Field of Classification Search ................. 430/296, 430/270.1, 291, 311, 313, 328, 330, 331, 430/322, 323, 324, 325, 327; 250/492.1, 250/492.2, 493.1, 494.1, 495.1, 503.1, 504 R, 250/492.22, 492.24, 504 H
See application file for complete search history.

(56) References Cited

U.S. PATENT DOCUMENTS

| | | | |
|---|---|---|---|
| 6,583,849 B1 * | 6/2003 | Noda et al. ................... 355/18 |
| 6,635,409 B1 * | 10/2003 | Lyons et al. ................ 430/313 |
| 7,202,175 B2 * | 4/2007 | Kin et al. .................... 438/704 |
| 2002/0135107 A1 * | 9/2002 | Nishi et al. ................. 264/630 |
| 2002/0160320 A1 * | 10/2002 | Shields et al. ............... 430/328 |
| 2005/0052632 A1 * | 3/2005 | Miyajima .................... 355/53 |
| 2006/0258809 A1 * | 11/2006 | Sugeta et al. ............... 525/206 |
| 2008/0124660 A1 * | 5/2008 | Wheland et al. ............ 430/322 |

* cited by examiner

*Primary Examiner*—Jack I Berman
*Assistant Examiner*—Nicole Ippolito Rausch
(74) *Attorney, Agent, or Firm*—Tung & Associates

(57) ABSTRACT

A method, tool, and machine for hardening a photoresist image while the photoresist image is immersed in a liquid.

21 Claims, 9 Drawing Sheets

RESIST COLLAPSE PREVENTION USING IMMERSED HARDENING

This application is a Divisional of U.S. patent application Ser. No. 11/043,598 filed Jan. 25, 2005.

FIELD OF THE INVENTION

This invention relates to methods of making semiconductor devices, and more particularly, to a method of making a semiconductor device including forming a photoresist features and treating the same to prevent the photoresist features from collapsing

BACKGROUND OF THE INVENTION

FIG. 1 illustrates a prior art method of making a semiconductor device including providing a semiconductor device 10 with a first layer 6 such as a dielectric layer having an upper surface 8. A photoresist layer 26 is deposited over the upper surface 8 of the first layer 6 and patterned and a development composition 22 is flowed over the photoresist layer 26 so that individual photoresist features are defined, such as a first photoresist feature 12 and a second photoresist feature 14 with a gap 16 therebetween. The first photoresist feature 12 includes an inside wall 18 facing an inside wall 20 of the second photoresist feature 14. The photoresist features 12 and 14 have an outside wall 19 and 21 respectively. FIG. 2 illustrates a prior art step in the semiconductor manufacturing wherein the development fluid or rinse fluid is spun dry in an effort to leave the individual photoresist features 12, 14. However, the photoresist features 12, 14 can collapse as illustrated in FIG. 2. The collapsing becomes more prevalent in situations where the aspect ratio, that is the photoresist thickness (height)/photoresist width ratio is greater than 3. The collapse problem is also prevalent when small photoresist features such as line widths less than 150 nm are formed.

As will be appreciated from FIG. 2, when the photoresist collapses typically the inner side wall 18 of the first photoresist feature 12 engages the inner side wall 20 of the second photoresist feature 14 to close off the gap 16 that was therebetween. FIG. 4 is a plan illustration of the collapsed photoresist features 12 and 14. It will be appreciated that there is no opening or gap 16 between the first photoresist feature 12 and the second photoresist feature 14 and therefore wet or dry etching materials, or other material cannot pass between the photoresist features.

Messick et al., U.S. Pat. No. 6,451,510, discloses one solution to preventing photoresist collapse. Messick et al. discloses a method of developing photoresist patterns on electronic component substrates such as semiconductor wafers using specially defined developer compositions in sequence with a specially defined rinse composition to develop an exposed photoresist pattern and then the developed pattern is rinsed. Both the developer composition and the rinse composition contain an anionic surfactant and, when these solutions are used in sequence, they form a photoresist pattern which avoids pattern collapse even with small features such as line widths less than 150 nm and with aspect ratios greater than about 3. Disclosed as suitable anionic surfactants are ammonium perfluoroalkyl sulfonate and ammonium perfluoroalkyl carboxylate.

The present invention provides alternatives to the prior art.

SUMMARY OF THE INVENTION

One embodiment of the invention includes a method of making a semiconductor device including immersing a photoresist image in a liquid and hardening the photoresist image while immersed in the liquid.

In one embodiment of the invention the hardening of the photoresist image comprises directing infrared light on a photoresist image.

In another embodiment of the invention the hardening of the photoresist image comprises directing infrared radiation comprising wavelengths ranging from 700 nm to 2 micrometers.

One embodiment of the invention further comprises heating the liquid prior to immersing the photoresist image therein.

One embodiment of the invention further comprises pressurizing the liquid to raise its boiling point.

In another embodiment of the invention the liquid comprises a reactive substance to react with the photoresist.

In one embodiment of the invention the hardening comprises electrically heating of the liquid.

In another embodiment of the invention the liquid comprises water and further comprising electrically heating the water.

In another embodiment of the invention the hardening comprises directing ultraviolet light on the photoresist image.

In another embodiment of the invention comprises directing ultraviolet light on the photoresist image and heating the liquid.

Another embodiment of the invention comprises directing ultraviolet light on the photoresist image and wherein the ultraviolet light includes wavelengths between 150 nm and 480 nm.

In another embodiment of the invention the liquid comprises a surfactant.

In another embodiment of the invention the surfactant comprises an alcohol.

In another embodiment of the invention the photoresist comprises a material including at least one of $OH^-$ or $COO^-$ functional groups and wherein the liquid comprises a chemical that reacts with at least of one said functional groups.

Another embodiment of the invention comprises a tool for hardening a photoresist image while the photoresist image is immersed in a liquid.

Another embodiment of the invention further includes a pressurizing means for the liquid.

Another embodiment of the invention includes a heating means for the liquid.

Another embodiment of the invention includes an ultraviolet illuminator.

Another embodiment of the invention includes an ultraviolet illuminator comprising at least one ultraviolet source and at least one ultraviolet condenser.

Another embodiment of the invention includes an ultraviolet light source capable of producing wavelengths between 150 nm and 480 nm.

Another embodiment of the invention comprises an infrared illuminator.

Another embodiment of the invention comprises an infrared illuminator comprising at least one infrared source and at least one infrared condenser.

Another embodiment of the invention includes an infrared light source capable of producing wavelengths between 700 nm and 2 micrometers.

Another embodiment of the invention includes a chamber and means for flowing a liquid into the chamber.

Another embodiment of the invention includes a semiconductor wafer assembly machine comprising a photoresist depositing station, an exposure station, a PEB station, a developing station, a rinse station, a photoresist hardening station, and a drying station.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Embodiments of the present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
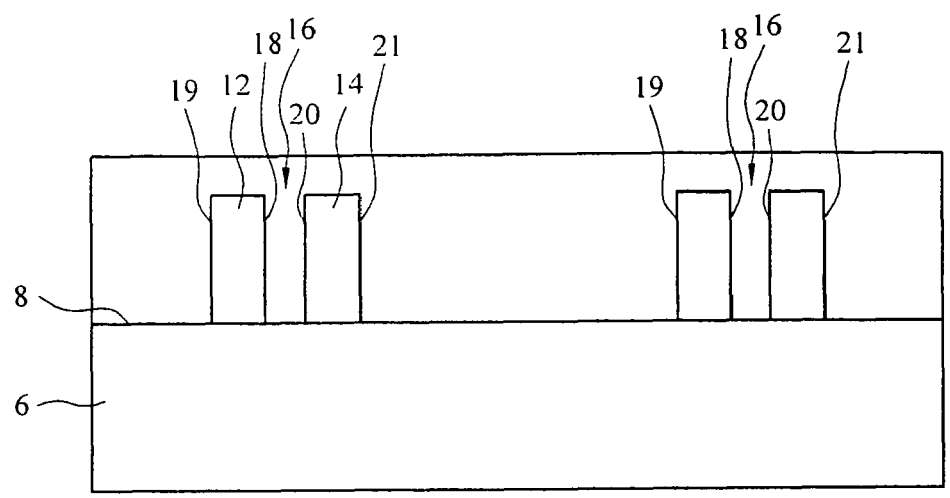
FIG. 1 illustrates a prior art method of developing a photoresist image.
Figure 2:
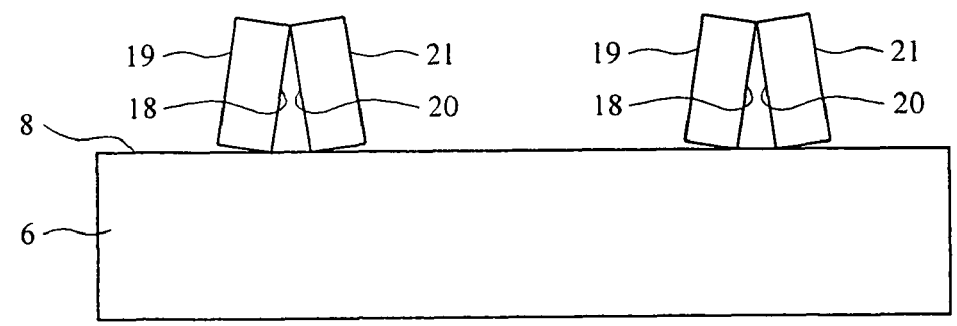
FIG. 2 illustrates a prior art method wherein photoresist features collapse during spin drying.
Figure 3:
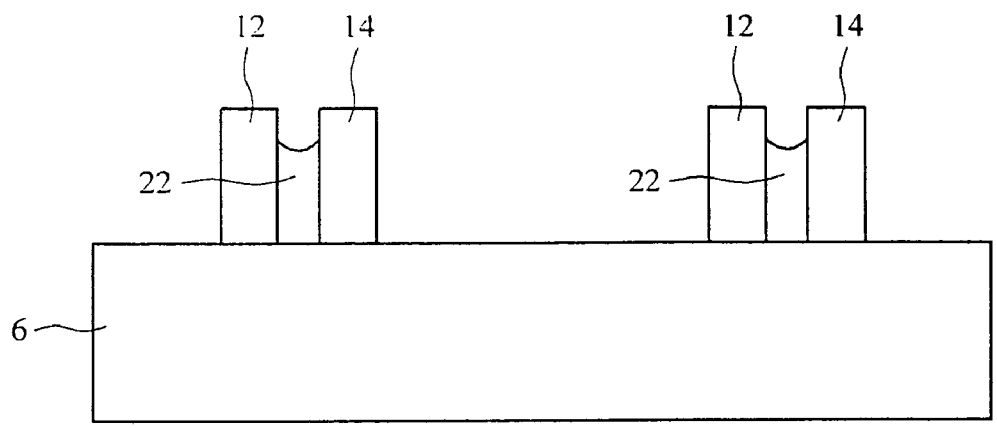
FIG. 3 illustrates the capillary force in the fluid between photoresist elements.
Figure 4:
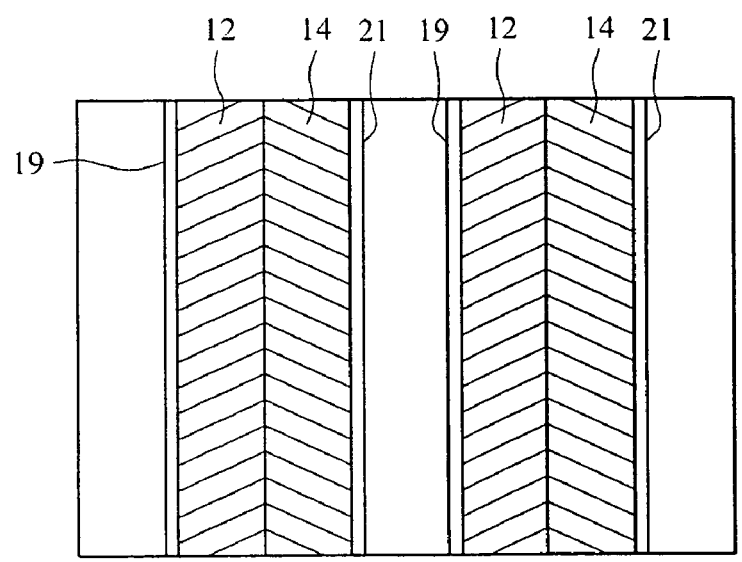
FIG. 4 illustrates a plan view of a prior art semiconductor with photoresist elements collapsed.

Referring now to FIG. 3, as indicated earlier, a semiconductor device 10 may include a first photoresist feature 12 and a second photoresist feature 14 with a gap 16 therebetween. The first photoresist element 12 includes an inner wall 18 which is hydrophilic. The second photoresist element 14 includes an inner wall 20 which is also hydrophilic. One aspect of the present invention includes the discovery that the adjacent photoresist elements 12 and 14 create a capillary force in the fluid 22 that is therebetween.

Figure 5A:
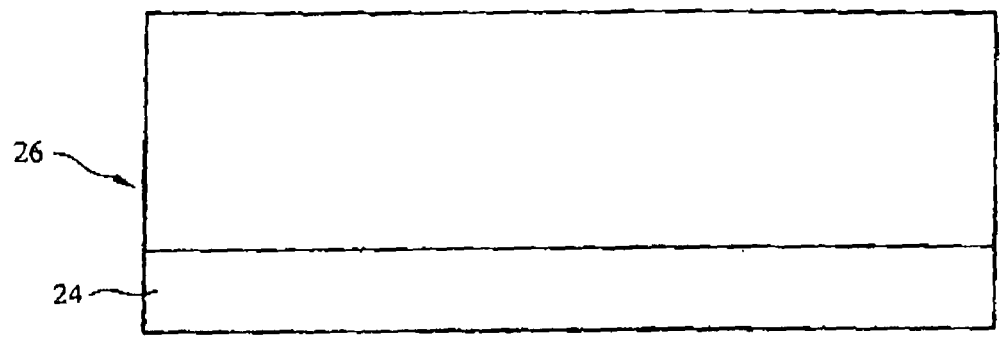
FIG. 5A illustrates a method according to one embodiment of the present invention including forming a photoresist layer over a substrate.
Figure 5B:
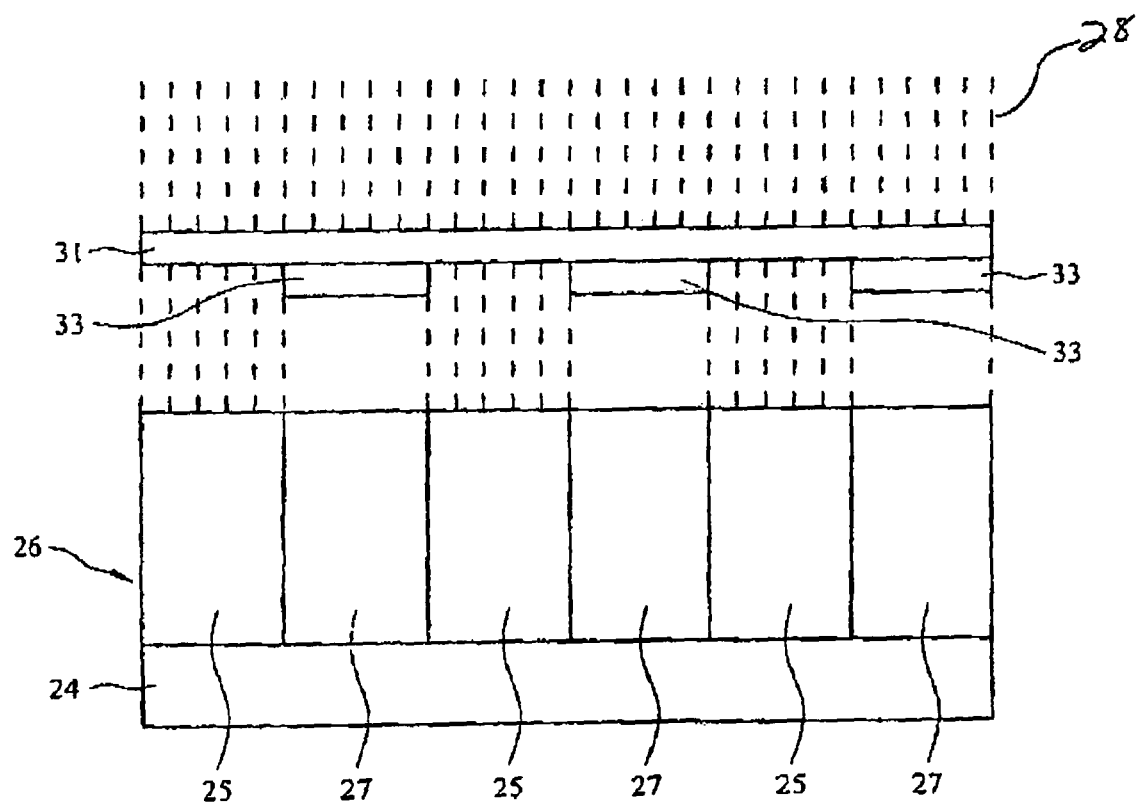
FIG. 5B illustrates a method according to one embodiment of the present invention including exposing the photoresist layer.
Figure 5C:
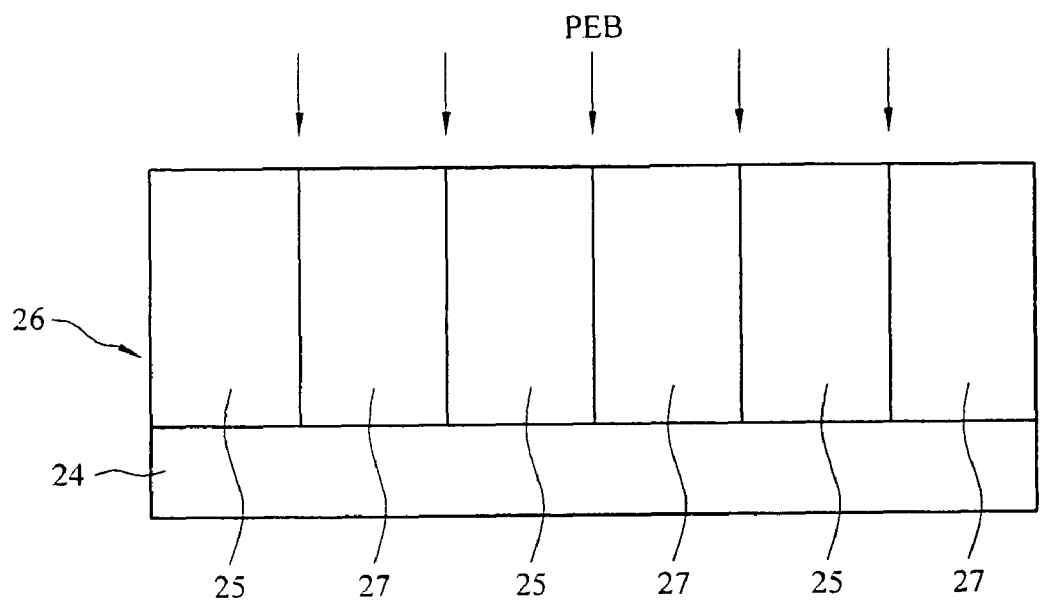
FIG. 5C illustrates a method according to one embodiment of the present invention including a PEB step.

Referring now to FIGS. 5A-G, one embodiment of the present invention includes making a semiconductor device including depositing a photoresist layer 26 over a first layer 24, which may be a substrate, dielectric layer, or metallization layer as shown in FIG. 5A. As shown in FIG. 5B, the photoresist layer 26 is exposed to light 28 shown through a mask 31 including blocking portions 33 that do not allow light to pass therethrough. The photoresist layer 26 includes exposed portions 25 and unexposed portions 27. As shown in FIG. 5C, the photoresist layer 26 is then subjected to a post exposure bake (PEB) step.

Figure 5D:
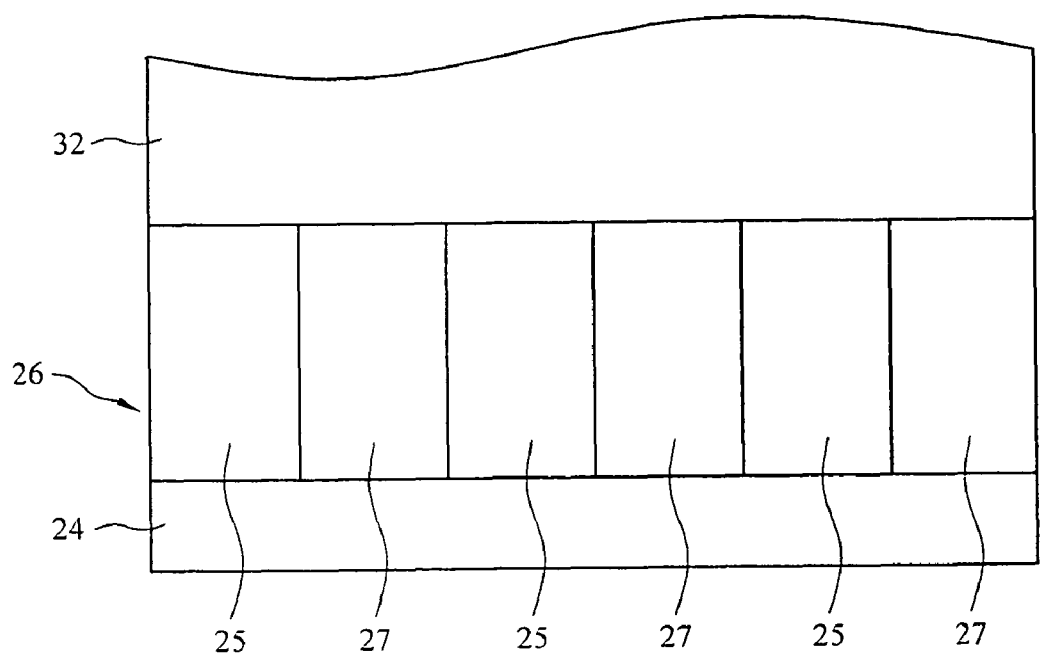
FIG. 5D illustrates a method according to one embodiment of the present invention including immersing a photoresist layer in a developer composition.
Figure 5E:
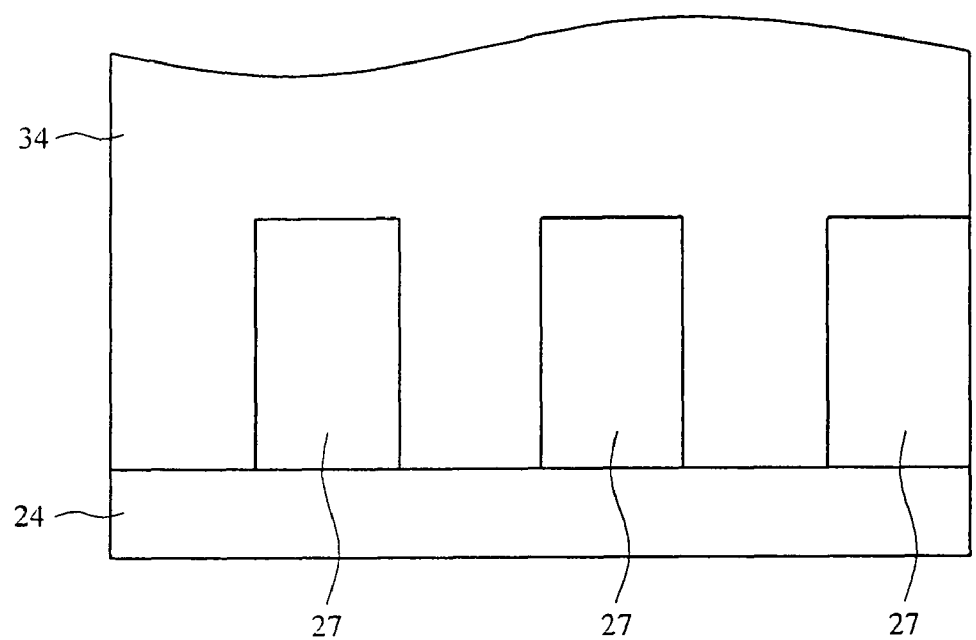
FIG. 5E illustrates a method according to one embodiment of the present invention including rinsing the photoresist layer.
Figure 5F:
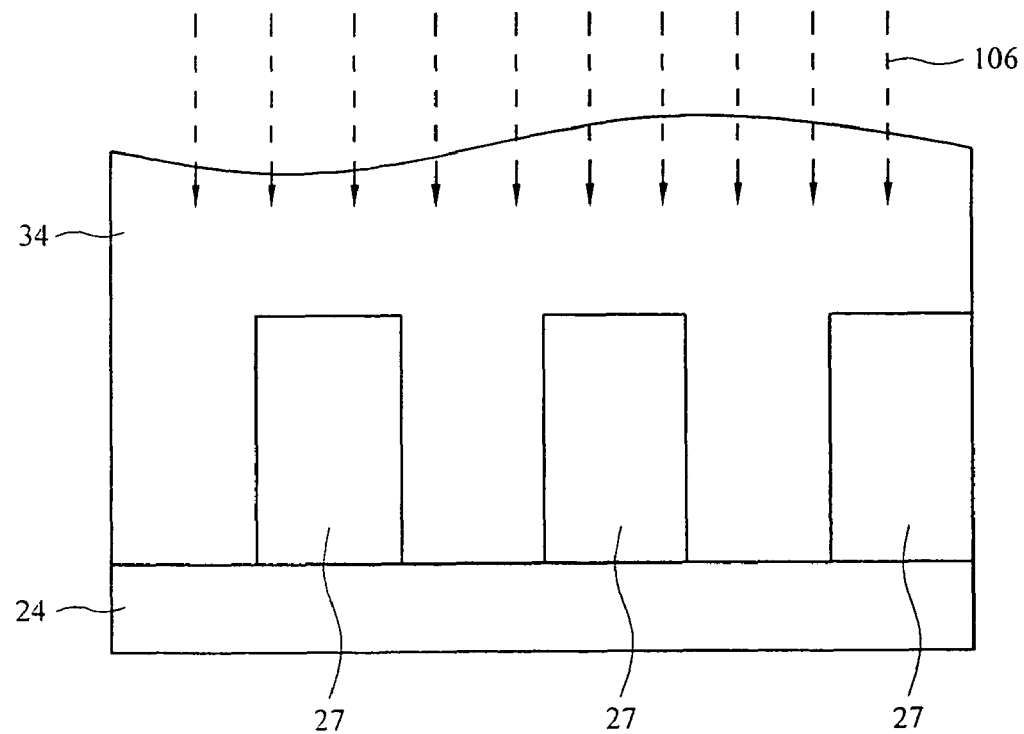
FIG. 5F illustrates a method according to one embodiment of the present invention including directing ultraviolet light onto the photoresist image while the image is immersed in a fluid to harden the photoresist image.
Figure 5G:
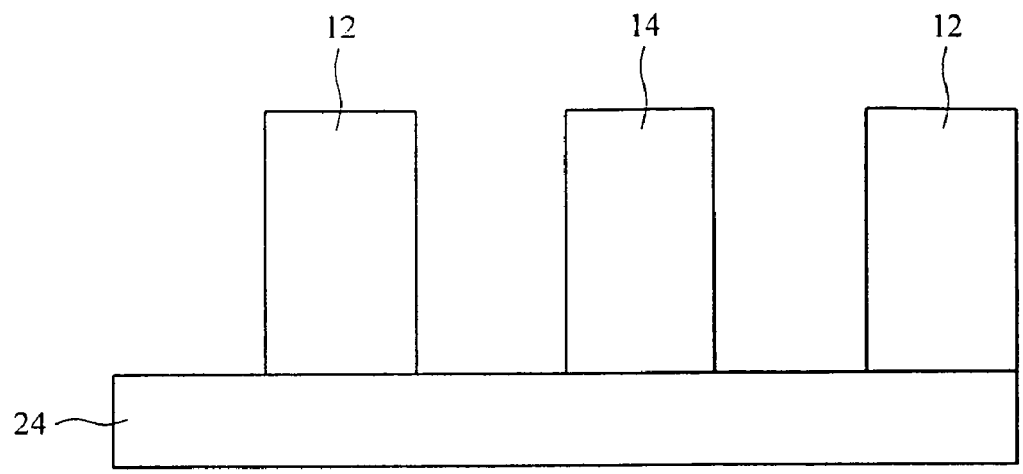
FIG. 5G illustrates a method according to one embodiment of the present invention including spin drying the semiconductor device after the photoresist image has been hardened and so that the photoresist image features do not collapse.

Thereafter, the photoresist layer 26 is exposed to a developer composition 32 which dissolves the exposed portion 25 of the photoresist layer 26 as shown in FIG. 5D. Referring now to FIG. 5E, the semiconductor device is rinsed so that the remaining unexposed portions 27 of the photoresist layer 26 are immersed in the rinse solution 34. As shown in FIG. 5F, thereafter the photoresist image is hardened, for example, by exposing the remaining elements 27 to ultraviolet light 106 while the photoresist elements 27 are immersed in a liquid 34. As shown in FIG. 5G, the semiconductor device 10 is then dried, for example, by spin drying to remove the rinse liquid and so that the photoresist elements 12 and 14 do not collapse and a gap 16 remains therebetween.

Figure 6:
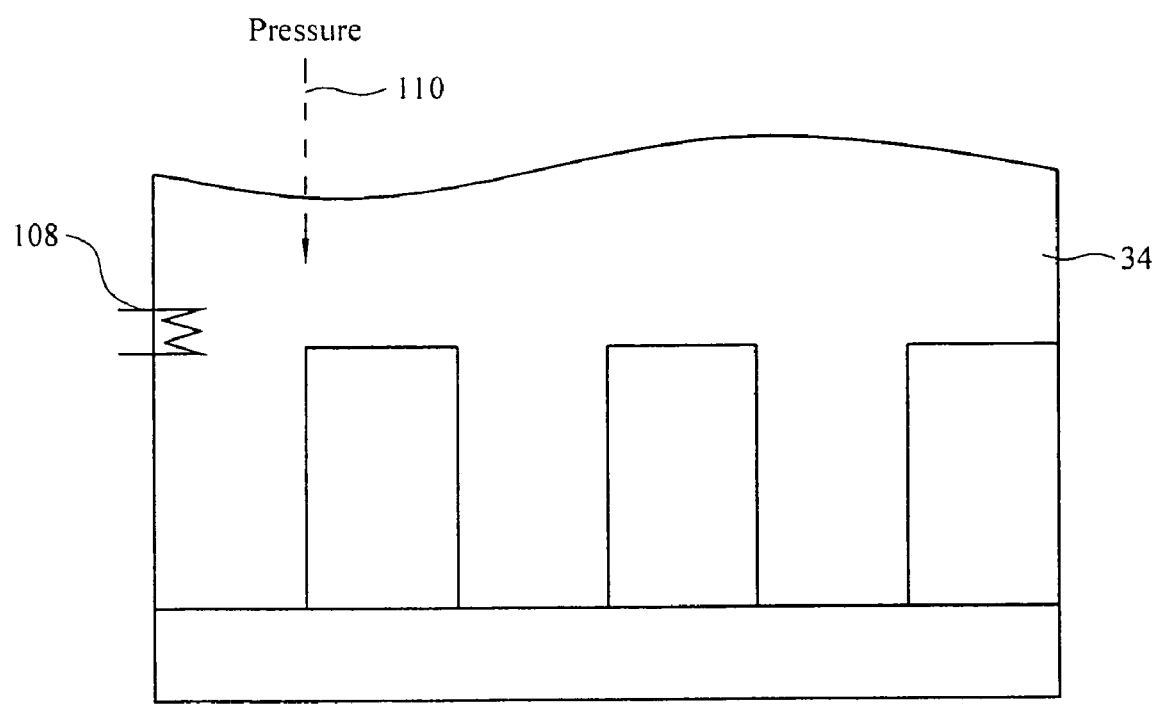
FIG. 6 illustrates an alternative embodiment of the present invention including heating a liquid in which a photoresist image is immersed to harden the photoresist image.

Referring now to FIG. 6, an alternative embodiment of the present invention includes heating the liquid 34 in which the photoresist elements 27 are immersed. The heating of the liquid 34 may occur prior to immersing the photoresist elements 27 in the liquid 34 or after the photoresist elements 27 have been immersed in the liquid 34, for example, by using a heater 108. The heating of the liquid may be accomplished by electrical heating, liquid gas heat exchanger or any other method known to those skilled in the art of heating a liquid. The liquid may be placed under pressure by, for example, by charging a gas through a port 110 into the chamber 42.

Figure 7:
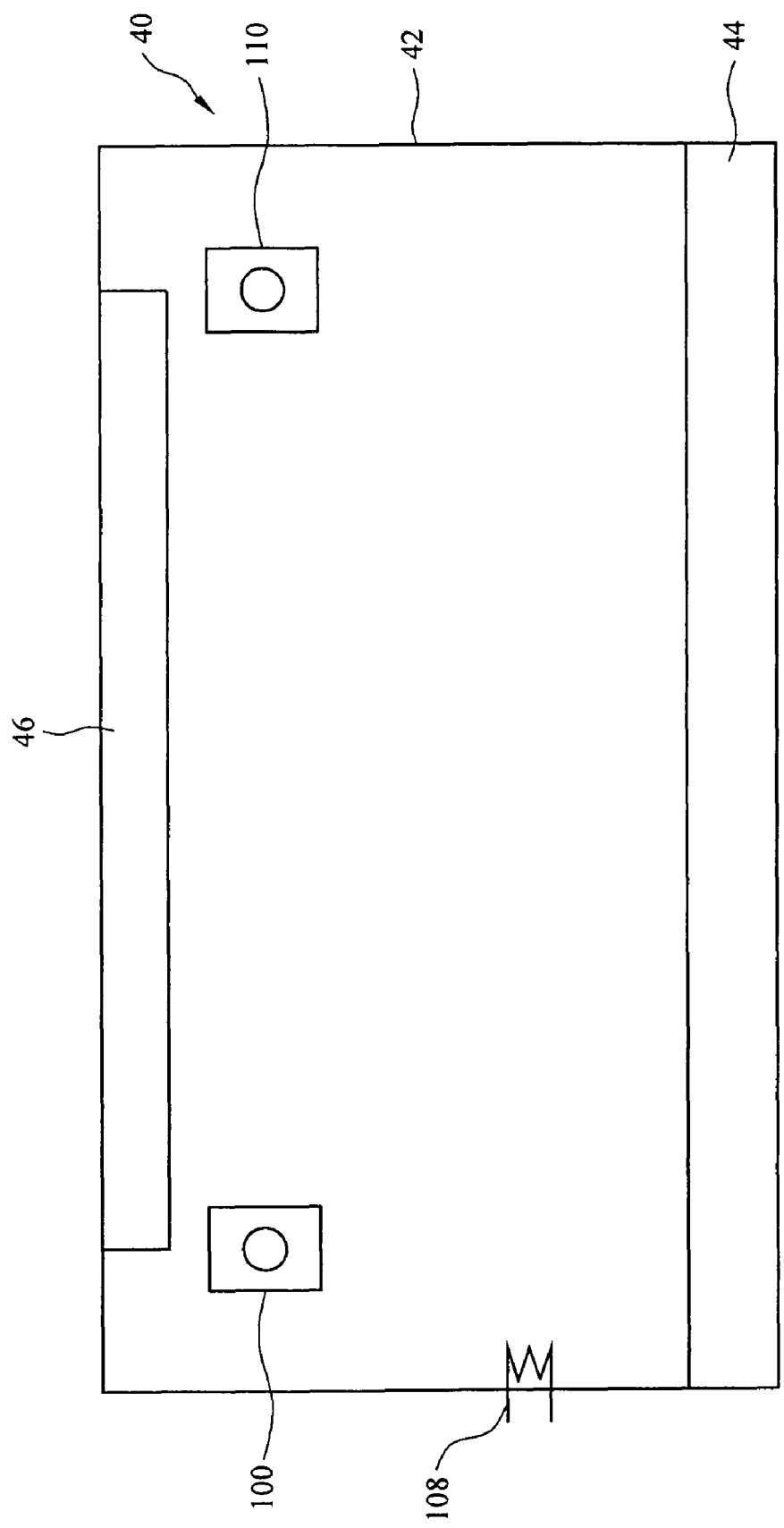
FIG. 7 illustrates a semiconductor manufacturing tool according to one embodiment of the present invention.

Referring now to FIG. 7, one embodiment of the invention includes a tool for hardening a photoresist image while immersed in the liquid. The tool 40 may include a chamber 42 and a support 44 for a semiconductor wafer. The tool may include an illuminator 46 which may be, for example, an ultraviolet light illuminator or an infrared radiation illuminator. The tool may also include a means for heating 38 a fluid introduced into the chamber, for example, through a port 100. The tool 40 may also include a means for applying pressure to the fluid, for example by, charging gas through a gas port 110.

Figure 8:
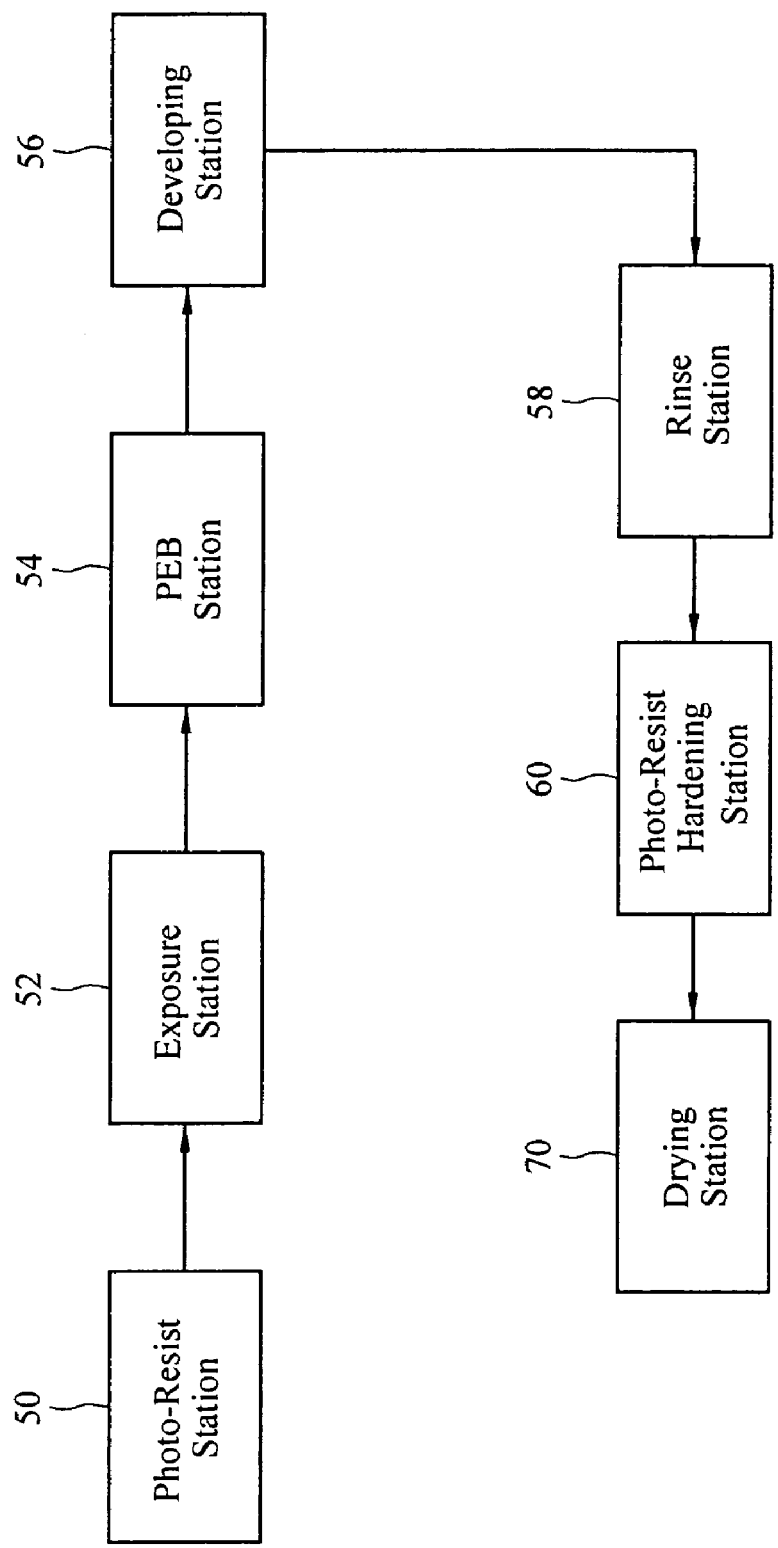
FIG. 8 illustrates a semiconductor assembly machine according to one embodiment of the present invention including a variety of stations.
Figure 9:
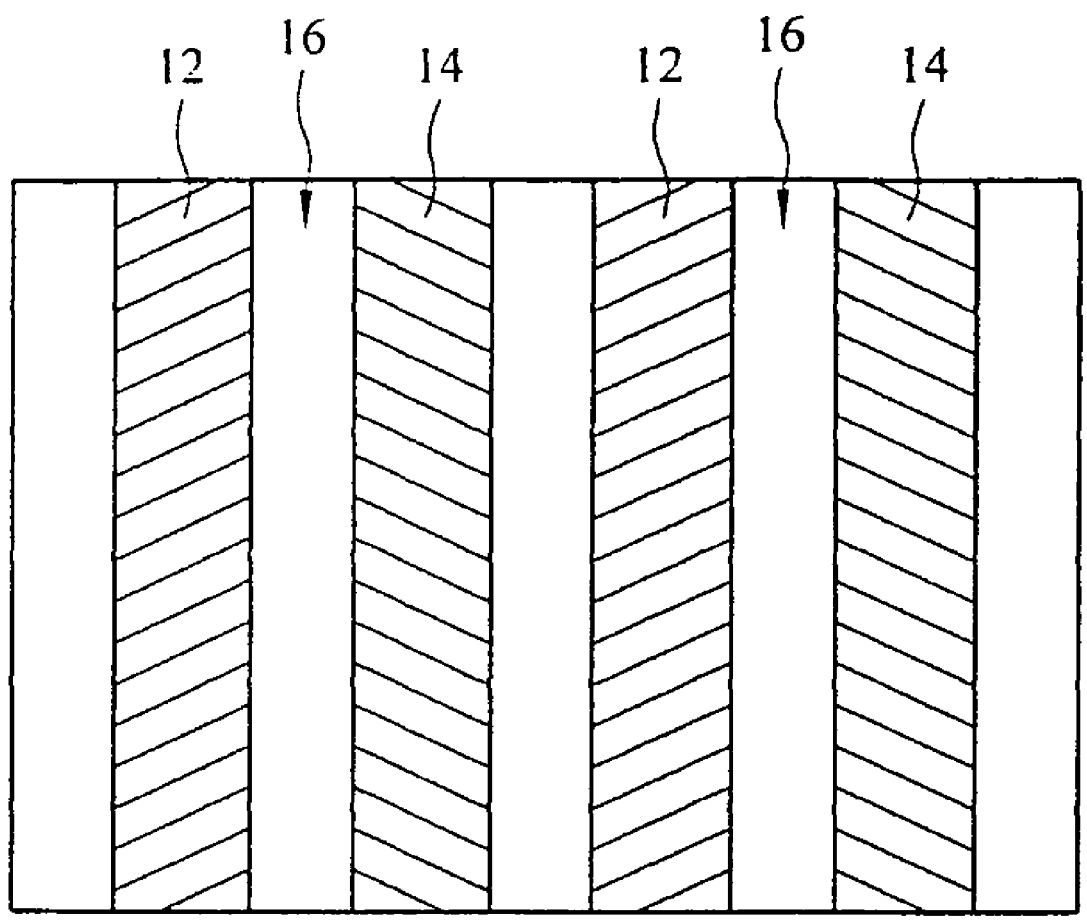
FIG. 9 illustrates a plan view of a semiconductor wafer according to one embodiment of the present invention including photoresist image that has been hardened while immersed in a fluid according to the present invention.

Referring now to FIG. 8, one embodiment of the invention includes a semiconductor machine including a photoresist depositing station 50, an exposure station 52 for exposing the photoresist material deposited on the semiconductor wafer, a PEB station 54, a developing station 56, a rinsing station 58, a photoresist hardening station 60 and a drying station 70.

In conventional processing, dense photoresist patterns suffer from collapse. To prevent such collapse, prior methods kept the photoresist thickness/width ratio to less than 3. However, conventional etching processes often require this ratio to be greater than 3. The problem was even worse for ArF photoresist because ArF photoresist is less etch resistant. Furthermore, design features for ArF photoresist are smaller than KrF photoresist. The hardening method of the present invention overcomes these prior art problems and the method can be used to make photoresist features in dense design dimensions and using a variety of exposure sources without the photoresist collapsing during the drying step. The photoresist features hardened according to the present invention allow for the trimming of the photoresist features to reduce the width of the feature. The photoresist features may be trimmer using a laser after the drying step.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A tool for making a semiconductor device comprising:
   a means for hardening a photoresist image while the photoresist image is immersed in a liquid, said means for hardening comprising a light source for illuminating said photoresist image while immersed in said liquid; and,
   a means for pressurizing the liquid while the photoresist image is immersed in the liquid.

2. A tool as set forth in claim 1 further comprising a heating means for the liquid.

3. A tool as set forth in claim 1 wherein said light source comprises an ultraviolet illuminator.

4. A tool as set forth in claim 3 wherein the ultraviolet illuminator comprises at least an ultraviolet light source and an ultraviolet condenser.

5. A tool as set forth in claim 3 wherein the ultraviolet illuminator produces wavelengths between 150 nm and 480 nm.

6. A tool as set forth in claim 1 wherein said light source comprises an infrared illuminator.

7. A tool as set forth in claim 6 wherein the infrared illuminator comprises an infrared source and an infrared condenser.

8. A tool as set forth in claim 6 wherein the infrared illuminator produces infrared light comprising wavelengths between 700 nm and 2 microns.

9. A tool as set forth in claim 1, wherein said means for hardening comprises an enclosed chamber for immersing said photoresist image.

10. A tool as set forth in claim 9, wherein said means for pressurizing the liquid comprises a gas port for charging gas into said enclosed chamber.

11. A semiconductor manufacturing machine comprising:
    a photoresist deposing station, a photoresist exposure station, a post exposure bake station, a developing station, a rinse station, a photoresist hardening station and a drying station;
    wherein the hardening station comprises a light source for illuminating and hardening photoresist image while the photoresist image is immersed in a liquid; and,
    a means for pressurizing the liquid while the photoresist image is immersed in the liquid and being illuminated.

12. A semiconductor manufacturing machine as set forth in claim 11 wherein the light source comprises an ultraviolet light source.

13. A semiconductor manufacturing machine as set forth in claim 11 wherein the light source comprises an infrared source.

14. A semiconductor manufacturing machine as set forth in claim 11 wherein the hardening station comprises a heating source for heating a liquid.

15. A semiconductor manufacturing machine as set forth in claim 11 wherein the photoresist exposure station comprises an ArF source.

16. A tool for making a semiconductor device comprising:
    an enclosed chamber for hardening said photoresist image while the photoresist image is immersed in a liquid in said chamber;
    a light source for illuminating said photoresist image while said photoresist image is immersed in said liquid; and,
    a gas port in said chamber for charging gas into said chamber to pressurize said liquid while said photoresist image is immersed in said liquid.

17. A tool as set forth in claim 16 further comprising a heating means for the liquid.

18. A tool as set forth in claim 16 wherein said light source comprises an ultraviolet illuminator.

19. A tool as set forth in claim 18 wherein the ultraviolet illuminator produces wavelengths between 150 nm and 480 nm.

20. A tool as set forth in claim 16 wherein said light source comprises an infrared illuminator.

21. A tool as set forth in claim 20 wherein the infrared illuminator produces infrared light comprising wavelengths between 700 nm and 2 microns.

* * * * *